(12) United States Patent
Bayn et al.

(10) Patent No.: US 10,914,892 B2
(45) Date of Patent: Feb. 9, 2021

(54) GERMANIUM PHOTODETECTOR COUPLED TO A WAVEGUIDE

(71) Applicant: Cisco Technology, Inc., San Jose, CA (US)

(72) Inventors: Igal I. Bayn, New York, NY (US); Vipulkumar Patel, Breinigsville, PA (US); Prakash B. Gothoskar, Allentown, PA (US); Sean P. Anderson, Macungie, PA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 16/164,695

(22) Filed: Oct. 18, 2018

(65) Prior Publication Data

US 2020/0124791 A1    Apr. 23, 2020

(51) Int. Cl.
| | | |
|---|---|---|
| *G02B 6/12* | (2006.01) | |
| *H01L 31/0232* | (2014.01) | |
| *H01L 31/105* | (2006.01) | |
| *G02B 6/122* | (2006.01) | |
| *H01L 31/028* | (2006.01) | |

(52) U.S. Cl.
CPC ....... *G02B 6/12004* (2013.01); *G02B 6/1228* (2013.01); *H01L 31/028* (2013.01); *H01L 31/02327* (2013.01); *H01L 31/105* (2013.01); *G02B 2006/12061* (2013.01); *G02B 2006/12138* (2013.01)

(58) Field of Classification Search
CPC .................. G02B 6/12004; H01L 31/0232
USPC .......................................................... 385/14
See application file for complete search history.

(56) References Cited

U.S. PATENT DOCUMENTS

| | | | |
|---|---|---|---|
| 9,978,890 B1 | 5/2018 | Bayn et al. | |
| 10,388,806 B2 * | 8/2019 | Chen | H01L 31/102 |
| 2004/0188794 A1 * | 9/2004 | Gothoskar | H01L 31/03682 257/459 |
| 2005/0169593 A1 * | 8/2005 | Hwang | G02B 6/12004 385/131 |
| 2008/0193076 A1 * | 8/2008 | Witzens | G02B 6/12007 385/14 |

(Continued)

OTHER PUBLICATIONS

Donghwan Ahn, Ching-yin Hong, Jifeng Liu, Wojciech Giziewicz, Mark Beals, Lionel C. Kimerling, Jurgen Michel, Jian Chen, and Franz X. Kärtner, "High performance, waveguide integrated Ge photodetectors," Opt. Express 15, 3916-3921 (2007).

(Continued)

*Primary Examiner* — Eric Wong
(74) *Attorney, Agent, or Firm* — Patterson + Sheridan, LLP

(57) ABSTRACT

A photonic device can include an optical detector (e.g., a photodetector) coupled to silicon waveguides. Unlike silicon, germanium is an efficient detector at the wavelength of optical signals typically used for data communication. Instead of directly coupling the waveguide to the germanium, in one embodiment, the waveguide extends below the germanium but is spaced sufficiently away from the germanium so that the optical signal is not transferred. Instead, an optical transfer structure (e.g., a tapered waveguide or an optical grating) is disposed between the germanium and the waveguide. The waveguide first transfers the optical signal into the optical transfer structure which then transfers the optical signal into the germanium.

20 Claims, 8 Drawing Sheets

(56) References Cited

U.S. PATENT DOCUMENTS

| | | | |
|---|---|---|---|
| 2011/0156183 A1* | 6/2011 | Liu | G02B 6/4215 |
| | | | 257/432 |
| 2012/0025265 A1* | 2/2012 | Ji | H01L 31/1804 |
| | | | 257/184 |
| 2015/0117808 A1* | 4/2015 | Chen | G02B 6/30 |
| | | | 385/2 |
| 2018/0212080 A1* | 7/2018 | Meyer | H01L 31/109 |
| 2018/0231714 A1* | 8/2018 | Collins | G02B 6/12002 |
| 2019/0265415 A1* | 8/2019 | Psaila | G02B 6/13 |

OTHER PUBLICATIONS

C. R. Doerr, "Silicon photonic integration in telecommunications", Frontiers in Physics, vol. 3, Article 37 (2015) 16 pages.

Donghwan Ahn, Lionel C. Kimerling, and Jurgen Michel, "Evanescent Coupling Device Design for Waveguide-Integrated Group IV Photodetectors," J. Lightwave Technol. 28, 3387-3394 (2010).

\* cited by examiner

GERMANIUM PHOTODETECTOR COUPLED TO A WAVEGUIDE

TECHNICAL FIELD

Embodiments presented in this disclosure generally relate to optical detectors, and more specifically, to using an optical transfer structure to transfer an optical signal into an optimal region of an optical detector material in the optical detector.

BACKGROUND

Silicon-on-Insulator (SOI) optical devices may include an active surface layer that includes waveguides, optical modulators, detectors, CMOS circuitry, metal leads for interfacing with external semiconductor chips, and the like. The active surface can also include photodetectors that convert the light propagating in the waveguides into electrical signals. Although crystalline silicon is excellent at forming waveguides with submicron dimensions, silicon is a poor material for both generating and absorbing light at wavelengths used for digital communication. While III-V semiconductors are better suitable for photodetectors, these material are expensive and their fabrication techniques are less advanced than those used for silicon.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

Figure 1:
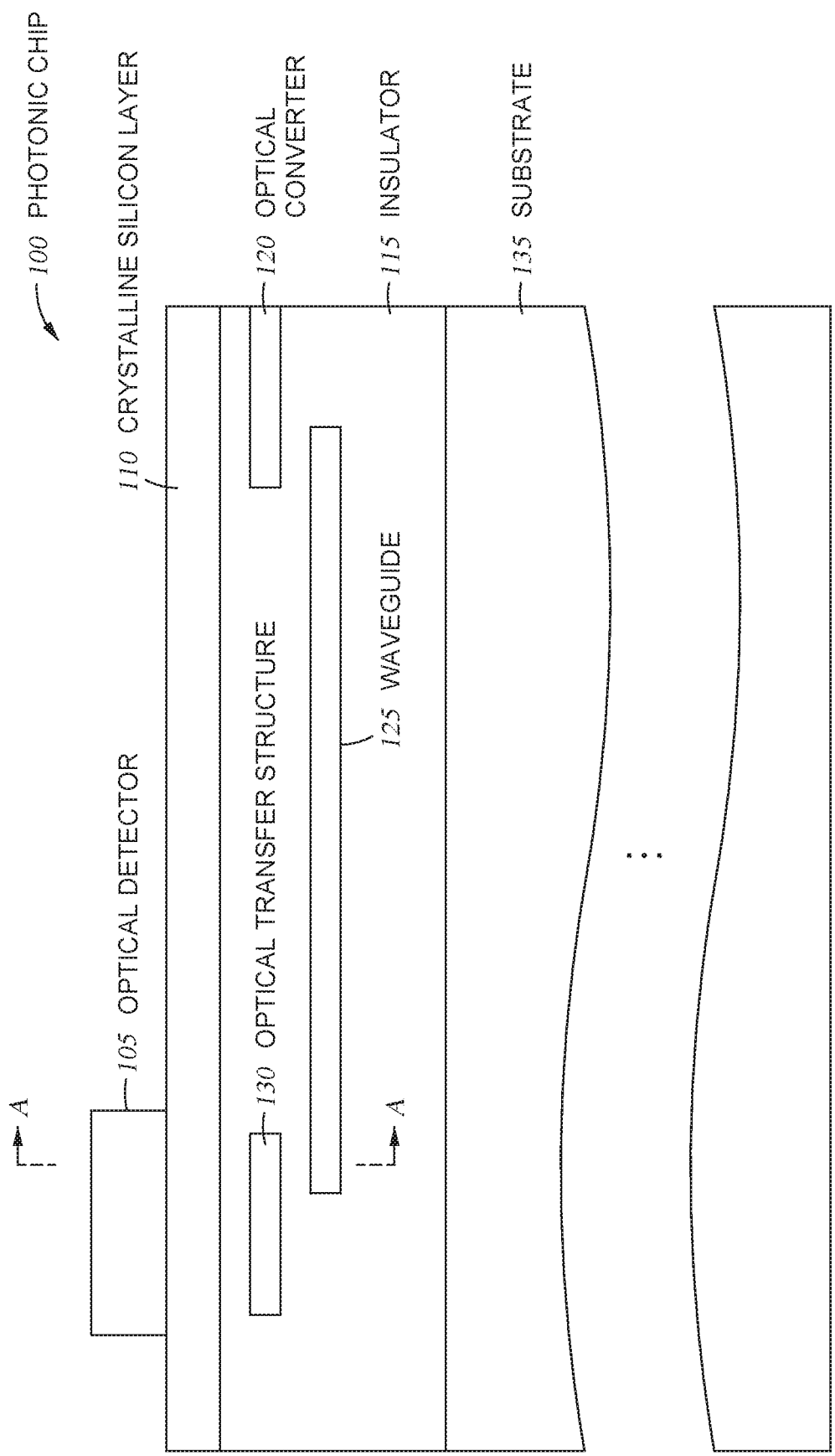
FIG. 1 illustrates a photonic chip with an optical detector optically coupled to an optical converter via a waveguide and an optical transfer structure, according to one embodiment disclosed herein.

One embodiment presented in this disclosure is an optical detector that includes a substrate, germanium disposed on the substrate, a first waveguide disposed in the substrate and extending underneath the germanium, and an optical transfer structure disposed between the first waveguide and the germanium, where the optical transfer structure is arranged to transfer an optical signal propagating in the first waveguide into the germanium, where the germanium is configured to convert the optical signal into an electrical signal.

Another embodiment presented in this disclosure is an optical system that includes a substrate, an optical detector material disposed on the substrate, a first waveguide disposed in the substrate and extending underneath the optical detector material, and an optical transfer structure disposed between the first waveguide and the optical detector material, where the optical transfer structure is arranged to transfer an optical signal propagating in the first waveguide into the optical detector material, where the optical detector material is configured to convert the optical signal into an electrical signal.

Another embodiment presented in this disclosure is a method that includes transmitting an optical signal in a first waveguide, where the first waveguide extends underneath an optical detector material, transferring the optical signal from the first waveguide into an optical transfer structure, where the optical transfer structure is disposed between the first waveguide and the optical detector material, transferring the optical signal from the optical transfer structure to the optical detector material, and converting the optical signal received in the optical detector material into an electrical signal.

Example Embodiments

The embodiments of the present disclosure describe a photonic device that includes an optical detector (e.g., a photodetector) coupled to silicon waveguides. Unlike silicon, germanium is an efficient detector at the wavelength of optical signals typically used for data communication. Moreover, because germanium and silicon are both group IV elements, germanium can be deposited or grown on crystalline silicon. In one embodiment, germanium is coupled to at least one silicon waveguide in the active layer of a SOI device to form an optical detector.

While the silicon waveguide can extend directly beneath the germanium to transfer the optical signal propagating through the waveguide into the germanium, doing so results in most of the optical signal being absorbed at an edge of the germanium. However, the edge of the germanium may have defects which contribute to dark current in the resulting electrical signal. Further, the electrical field which is used to convert the optical signal into the electrical signal may be weak at the edges of the germanium. Both of these phenomena can introduce errors into the resultant electrical signal.

Instead of directly coupling the waveguide to the germanium, in one embodiment, the waveguide extends below the germanium but is spaced sufficiently away from the germanium so that the optical signal is not transferred. Instead, an optical transfer structure (e.g., a tapered waveguide or an optical grating) is disposed between the germanium and the waveguide. The waveguide first transfers the optical signal into the optical transfer structure which then transfers the optical signal into the germanium. Instead of transferring the optical signal into an edge of the germanium, in one embodiment, the optical transfer structure transfers the optical signal at a bottom surface perpendicular to the edges of the germanium. Doing so may avoid the regions in the germanium that have defects and concentrate the optical signal in an area where the electrical field is stronger.

FIG. 1 illustrates a photonic chip 100 with an optical detector 105 optically coupled to an optical converter 120 via a waveguide 125 and an optical transfer structure 130, according to one embodiment disclosed herein. The photonic chip 100 includes a crystalline silicon layer 110, an insulator 115, and a semiconductor substrate 135 (e.g., crystalline silicon). The silicon layer 110 has been processed to include the optical detector 105. Although not shown, further processing steps can be used to connect the optical detector 105 to metal layers disposed above the silicon layer 110. The detector 105 may be formed by performing various fabrication steps on the silicon layer 110 such as etching or doping the silicon material as well as depositing or growing additional materials on the silicon layer 110 such as germanium. For example, the optical detector 105 may have an n-type and p-type doped region coupled to a metal contact for generating or transmitting electrical signals that correspond to the absorbed optical signal passing through the waveguide 125. Although not shown, the optical detector 105 may be electrically connected to an integrated circuit mounted onto the photonic chip 100 that receives and processes the electrical signals generated by the optical detector 105. In another embodiment, the integrated circuit may be physically separate from the photonic chip 100 but is couple to the chip 100 via a bond wire.

The waveguide 125 is buried in the insulator 115 which, in one embodiment, serves as a cladding for the waveguide 125. For example, the insulator 115 may be an insulative material such as silicon dioxide while the waveguide 125 is formed from silicon nitride or silicon oxynitride. However, the insulator 115 and the waveguide 125 are not limited to these materials and can be include any materials which have indices of refraction that permit the waveguide 125 to transmit an optical signal from the optical converter 120 to the optical transfer structure 130 and eventually to the optical detector 105. That is, in this example, the waveguide 125 transmits optical signals received from the optical converter 120 to the optical detector 105, but in other examples, the waveguide 125 may receive optical signals from other components in the photonic chip 100 which are then transmitted to the optical detector 105.

In addition to including components made from silicon, the silicon layer 110 may include other components which may be made from other materials (e.g., a germanium optical detector 105) or a combination of silicon with other materials. Thus, the silicon layer 110 can be any suitable semiconductor layer. The other materials may be deposited or grown on silicon layer 110 using any suitable fabrication techniques. Once the silicon layer 110 is processed to include the desired components, these components may be covered with a protective material (e.g., an electrical insulative material) which may serve as a suitable base for mounting additional circuitry on the photonic chip 100. In this manner, the substrate 135, the insulator 115, and the silicon layer 110 can form a silicon-on-oxide (SOI) structure that can be processed using any number of techniques to form a device for performing a particular application such as optical modulation, detection, amplification, generating an optical signal, and the like. Further, although a silicon photonic chip 100 is illustrated, the embodiments are not limited to such and the structures in FIG. 1 can be formed using different semiconductor substrates (e.g., III-V semiconductors).

As shown, one interface or end of the optical converter 120 is optically coupled to the waveguide 125 while another interface or end is proximate to an outer or external surface of the photonic chip 100. Although the optical converter 120 is shown as being exposed on the outer surface of the chip 100, in other embodiments the converter 120 may be recessed slightly from the outer surface. In one embodiment, the converter 120 may be made of the same material as the waveguide 125 (e.g., silicon nitride or silicon oxynitride). Although shown as being disposed in the insulator 115, in other embodiments the optical converter 120 is formed in the silicon layer 110.

In one embodiment, the optical converter 120 may include a plurality of stacked layers that are processed (e.g., etched) such that an optical signal striking the exposed surface of the converter 120 is focused into the waveguide 125. The optical converter 120 may couple light from the sides (or top or bottom surfaces) of the photonic chip 100 into the waveguide 125. The optical converter 120 may be designed to efficiently couple to an external light-carrying medium. Because the dimensions of the waveguide 125 may result in high optical losses if directly connected to an external light-carrying medium, the light-carrying medium may instead be coupled to the converter 120 which then transfers the signal into the waveguide 125. Doing so may eliminate the need for using lenses between the external light-carrying medium and the waveguide 125 which focus the optical signal into a mode with a diameter similar to the dimensions of the waveguide 125. Stated differently, in one embodiment, the converter 120 may permit the external light-carrying medium to transmit light directly into photonic chip 100 without the addition of external focusing elements such as lenses.

Figure 2:
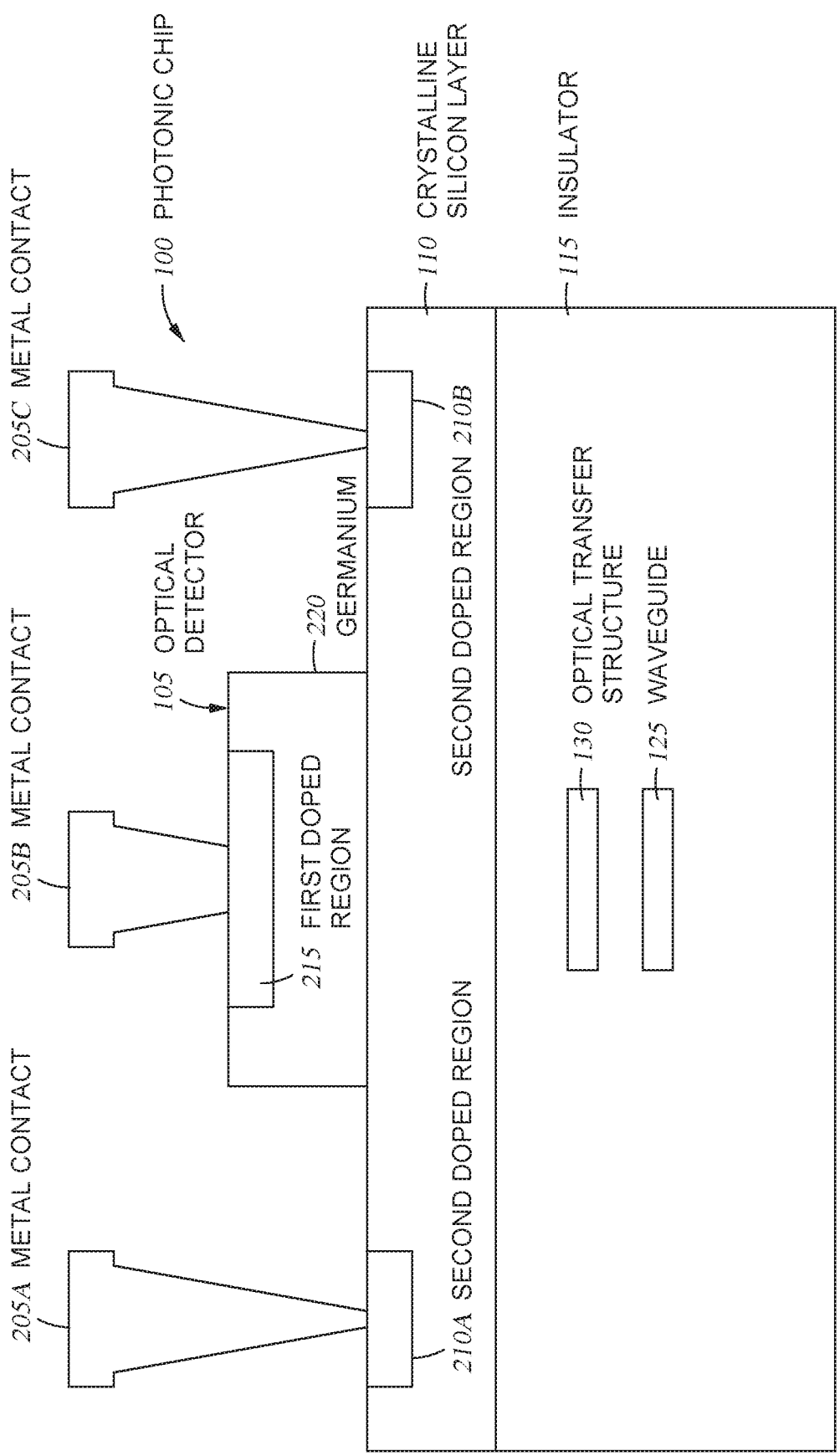
FIG. 2 illustrates optically coupling the waveguide to the optical detector using the optical transfer structure, according to one embodiment herein.

FIG. 2 illustrates optically coupling the waveguide 125 to the optical detector 105 using the optical transfer structure 130, according to one embodiment herein. FIG. 2 illustrates a view of the photonic chip 100 according to the cross section illustrated by dotted line A-A in FIG. 1. Moreover, FIG. 2 illustrates additional features that were not illustrated in FIG. 1 for clarity.

As shown, FIG. 2 includes metal contacts 205 which connect the silicon layer 110 and the optical detector 105 to upper metalization or routing layers (not shown) in the chip 100. That is, the metal contact 205B contacts a first doped region 215 in germanium 220 while the metal contacts 205A and 205C contact second doped regions 210 in the silicon layer 110. The first doped region 215 is doped with a different conductivity type than the second doped regions 210. For example, the first doped region 215 may be doped with an n-type dopant while the second doped regions 210 are doped with an opposite type dopant—e.g., a p-type dopant, or the first doped region 215 is doped with a p-type dopant and the second doped regions 210 are doped with an opposite type dopant—e.g., an n-type dopant. In either case, the first doped region 215 and the second doped regions 210 can establish a PIN diode where the portions of the silicon layer 110 and the germanium 220 between the first and second doped regions 215, 210 form an intrinsic region.

The optical transfer structure 130 and the waveguide 125 are disposed beneath the silicon layer 110. That is, the optical transfer structure 130 is disposed between the waveguide 125 and the silicon layer 110 as well as the between the waveguide 125 and the germanium 220. In one embodiment, the optical transfer structure 130 transfers an optical signal propagating in the waveguide 125 from the waveguide 125 into the silicon layer 110 and the germanium 220. As described in more detail below, the optical detector 105 converts the optical signal absorbed in the germanium 220 into a corresponding electrical signal which is defined by an electrical current in the metal contacts 205.

The optical transfer structure 130 can be implemented using a variety of different techniques. In one embodiment, the optical transfer structure can include a tapering waveguide or a diffraction grating in order to transfer the optical signal from the waveguide 125 into the germanium 220. By driving voltages onto the first and second doped regions 210, 215, the photonic chip 100 creates an electrical field. The optical transfer structure 130 can transfer the optical signal into the optical detector 105 such that most of the optical signal is in a portion of the germanium 220 that has a strong electric field which improves the performance of the optical detector 105. Stated differently, the optical transfer structure 130 transfers the optical signal from the waveguide 125 into a predetermined, optimal region of the germanium 220.

Figure 3:
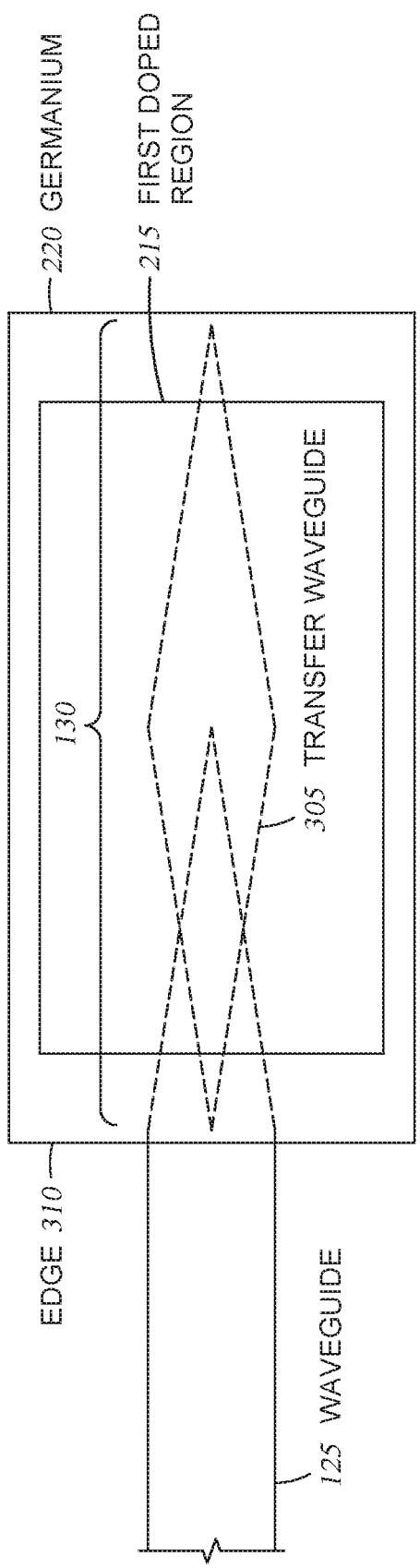
FIG. 3 illustrates a top view of a germanium optical detector illustrated in FIG. 2, according to one embodiment described herein.

FIG. 3 illustrates a top view of a germanium optical detector illustrated in FIG. 2, according to one embodiment described herein. FIG. 3 illustrates the germanium 220 and the first doped region 215 shown in FIG. 2 but omits the metal contacts 205 and the silicon layer 110. Although the germanium 220 and the first doped region 215 have rectangular shapes, this is not a requirement. The germanium 220 could circular or be a polygon that has three sides, five sides, six sides, etc. In one embodiment, the width and length of the germanium 220 range from 1 micron to 50 microns. However, shrinking the size of the germanium can be advantageous to reduce the form-factor of a transceiver module containing the photonic chip 100 and to reduce power.

As shown, the first doped region 215 does not extend across the top surface of the germanium 220. Put differently, the first doped region 215 does not reach the edges of the germanium 220. Doing so can reduce the dark current generated by the germanium 220 relative to optical detector where the first doped region 215 extends to the sides of the germanium 220 (e.g., extends across the top surface of the germanium 220). In one embodiment, the first doped region 215 is recessed by at least 500 nm for each edge of the germanium 220.

In FIG. 3, a transfer waveguide 305 is one example of an optical transfer structure that can be used to transfer the optical signal propagating in the waveguide 125 up towards the germanium 220 (i.e., in a direction out of the page). Put differently, the optical signal in the waveguide 125 may be weakly (or not at all) optically coupled to the germanium 220. However, by first transferring the optical signal to the transfer waveguide 305, the optical signal is brought closer to the germanium 220 and is more strongly coupled to the optical detector. Alternatively, the optical signal could be transmitted to the germanium 220 using a waveguide in the silicon layer which is directly below the germanium 220. This approach means that the optical signal is strongly coupled to the germanium 220 at the edges. That is, the maximum absorption of the optical single in the germanium is at the edge where the waveguide in the silicon layer reaches the germanium 220. However, because of dark current, the first doped region 215 does not extend to the edges which means the location in the germanium 220 with the maximum absorption does not overlap with the first doped region 215. As a result, the electrical field in the germanium 220 is weak at the location in the germanium 220 where light absorption from the waveguide is the largest. This mean fewer of the charge carriers generated by absorbing the optical signal in the germanium 220 are captured by the electrical field formed by the first doped region 215 and the second doped regions (not shown in FIG. 3), thereby reducing the electrical signal generated by the optical detector and the bandwidth of the optical detector.

The waveguide 125 and the transfer waveguide 305, in contrast, inject the optical signal into a region of the germanium 220 that has a stronger electrical field—e.g., below the first doped region 215 at a bottom surface of the germanium 220. Doing so avoids the weak electrical fields around the edge of the germanium 220 and increases the bandwidth of the optical detector. Stated differently, the waveguide 125 and the germanium 220 can be spaced apart such that when the waveguide 125 reaches the germanium 220 at the edge 310, very little or none of the optical signal is absorbed by the germanium 220. Instead, after the optical signal begins to transfer from the waveguide 125 to the transfer waveguide 305 is the light transferred to, and absorbed by, the germanium 220 which corresponds to a location in the germanium where the electric field generated by the first doped region 215 is strong—e.g., directly underneath the first doped region 215, or more in the center of the germanium 220 (depending on the location of the first doped region 215). For example, using the embodiments herein, the germanium optical detector can have bandwidths that exceed 30 GHz and further can have bandwidths that reach and exceed 100 GHz.

The waveguide 125 and the transfer waveguide 305 are tapered to optical transmit the optical signal from the waveguide 125 to the transfer waveguide 305, and then to the germanium 220. The portions of the waveguide 125 and the transfer waveguide 305 that are below the germanium 220 are shown in phantom. In one embodiment, the waveguide 125 and the transfer waveguide 305 are formed and patterned before the germanium 220 and the first doped region 215 are formed on the photonic chip.

Figure 4:
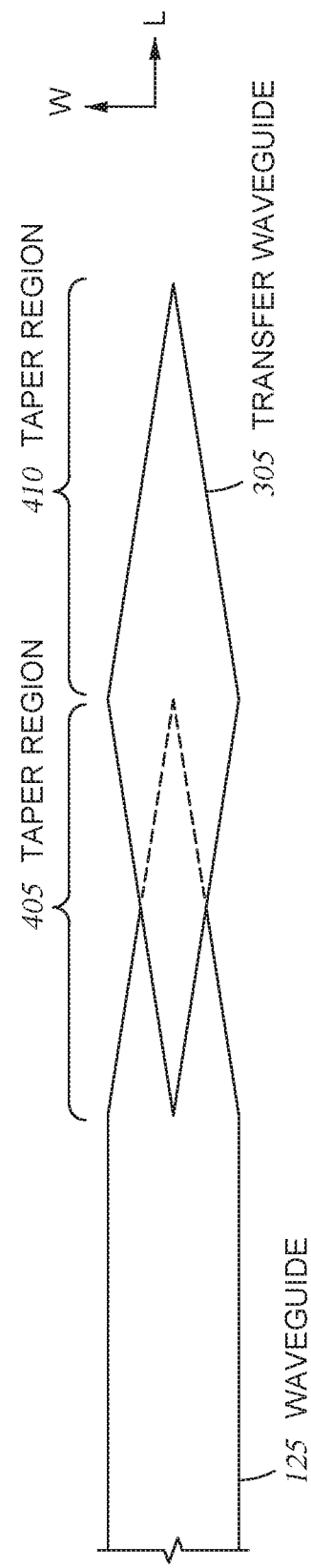
FIG. 4 illustrates a top view of a transfer waveguide and a waveguide, according to one embodiment described herein.

FIG. 4 illustrates a top view of the transfer waveguide 305 and the waveguide 125. For clarity, the germanium 220 and the first doped region 215 have been omitted so the details of the waveguides 305 and 125 can more easily be seen. As shown, the waveguide 125 has a width (W) that tapers (e.g., reduces) in a taper region 405. That is, the width of the waveguide 125 begins to decrease as the waveguide 125 extends below the transfer waveguide 305 (i.e., as the waveguide 125 extends from left to right). Although FIG. 4 illustrates the waveguide 125 beginning to taper when the waveguide 125 begins to extend underneath the transfer waveguide 305, in other embodiments the waveguide 125 may begin to taper before reaching the transfer waveguide 305 or after extending underneath the waveguide 305.

The transfer waveguide 305 also tapers in the taper region 405 but its width increases from left to right. The width of the waveguide 125, in contrast, continues to decrease as it extends underneath the transfer waveguide 305 as shown by the ghost lines until the waveguide 125 terminates. Increasing the width of the transfer waveguide 305 and decreasing the width of the waveguide 125 in the taper region 405 transfers the optical signal from the waveguide 125 to the transfer waveguide 305. In one embodiment, transferring the optical signal is performed adiabatically, and the mode of the optical signal remains constant.

In the taper region 410, the waveguide 125 has terminated and the width of the waveguide 305 begins to reduce. In one embodiment, the transfer waveguide 305 may start and terminate within the boundary of the germanium 220. However, in other embodiments, the transfer waveguide 305 may extend beyond the boundary of the germanium 220. Regardless, reducing the width of the transfer waveguide 305 in the taper region 410 helps to transfer the optical signal from the transfer waveguide 305 up into the germanium 220 where it is absorbed and converted into an electrical signal.

The taper regions 405 and 410 function together to transfer most of the optical signal into a region of the germanium 220 with the strongest electrical field as well as avoiding the edges of the germanium 220. Moreover, the taper regions 405 and 410 can result in the optical signal being optically coupled along the length of the germanium 220 (rather than concentrated at an edge 310). In one embodiment, the location of the transfer waveguide 305 with the greatest width (e.g., the middle of the transfer waveguide 305) is disposed underneath the first doped region 215 in the germanium 220. For example, the middle of the transfer waveguide 305 may be disposed in the middle of the germanium 220.

While FIG. 4 illustrates the transfer waveguide 305 tapering in both of the taper regions 405 and 410, in another embodiment the transfer waveguide 305 may taper in the region 405 but does not have the taper region 410. Instead, the transfer waveguide 305 may simply terminate without tapering at the right end. Moreover, instead of using a single waveguide, the optical transfer structure may include multiple waveguides.

Figure 5:
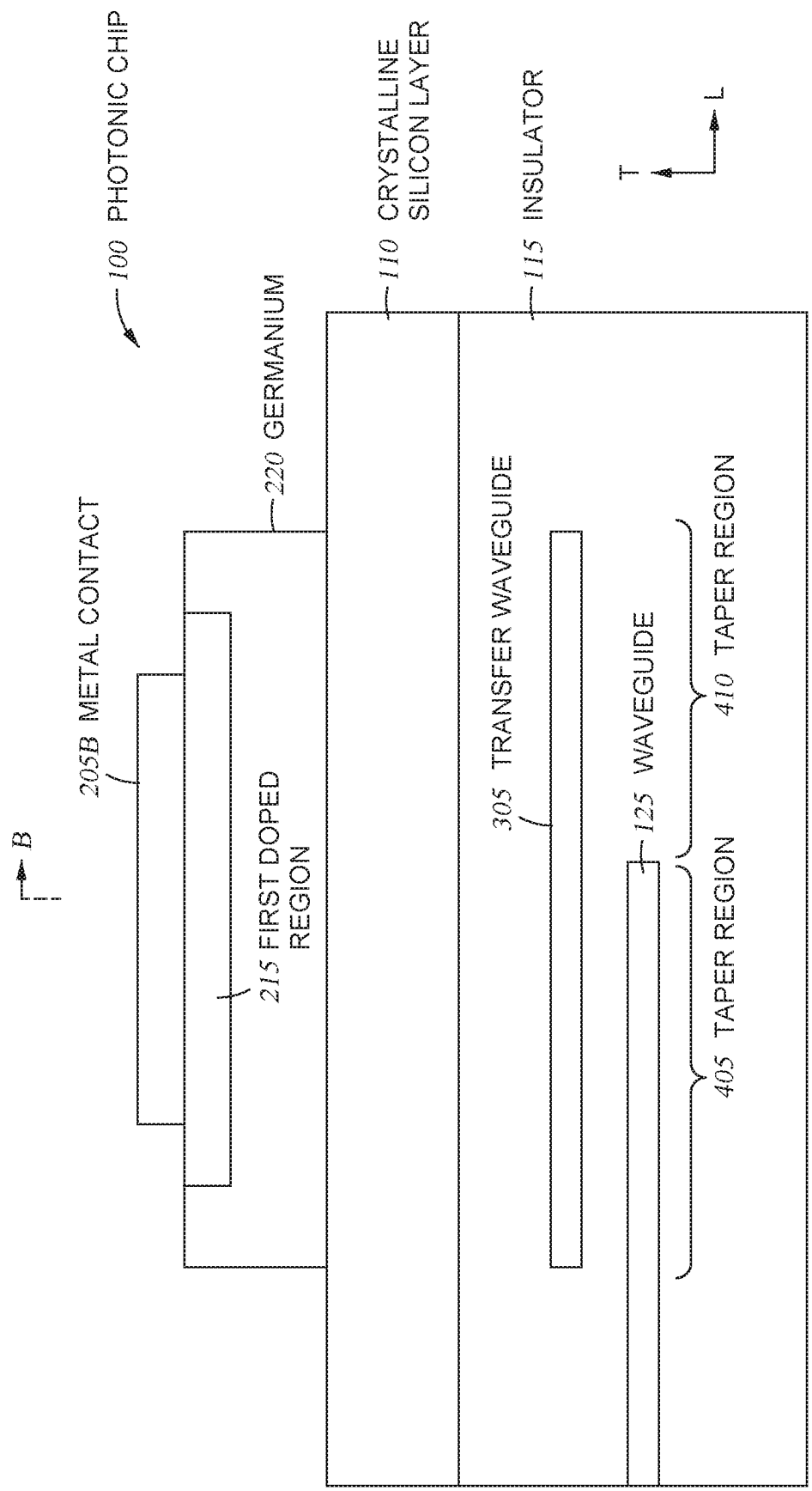
FIG. 5 illustrates a side view of the photonic chip, according to one embodiment described herein.

FIG. 5 illustrates a side view of the photonic chip 100, according to one embodiment described herein. In this example, the metal contact 205B contacts the first doped region 215 of the germanium 220. Further, the transfer waveguide 305 is disposed underneath the germanium 220, and at least a portion of the transfer waveguide 305 is between the germanium 220 and the waveguide 125. Furthermore, the transfer waveguide 305 is between the silicon layer 110 and the waveguide 125.

The taper region 405 and the taper region 410 are illustrated in FIG. 5. As shown, the transfer waveguide 305 begins at the left of the taper region 405, while the waveguide 125 terminates at the right of the taper region 405. While the FIG. 5 illustrates that the thickness (T) or height of the waveguides 125 and 305 remain constant in the taper regions 405, 410, in other embodiments the waveguides 125 and 305 may have changing thicknesses in the taper regions 405, 410 if permitted by the fabrication techniques used to form the photonic chip 100. For example, the thickness of the waveguide 125 may decrease from left to right in the taper region 405 while the thickness of the transfer waveguide 305 increases. Moreover, the thickness of the transfer waveguide 305 may decrease from left to right in the taper region 410.

In one embodiment, the germanium 220 has a longer length (L) (e.g., 3-50 microns) than width (e.g., 1-5 microns) to take advantage of the transfer waveguide 305 which can transfer the optical signal along its length to the germanium 220. However, in other embodiments, the germanium 220 may have the same width and length.

Figure 6:
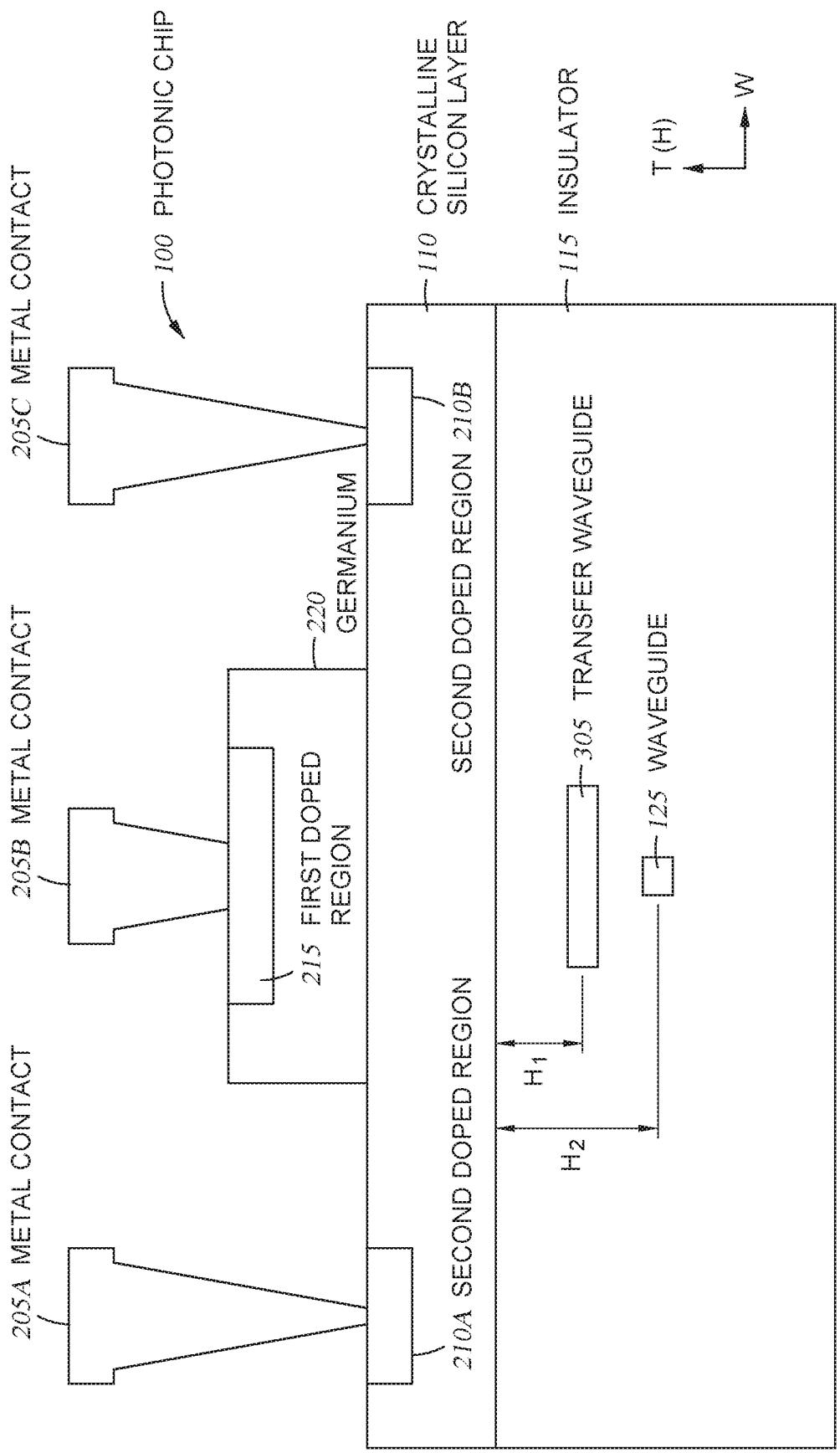
FIG. 6 illustrates a front view of the transfer waveguide and the waveguide in the photonic chip, according to one embodiment described herein.

FIG. 6 illustrates a front view of the transfer waveguide 305 and the waveguide 125 in the photonic chip 100, according to one embodiment described herein. Specifically, FIG. 6 is a cross section illustrated by the dotted line B-B in FIG. 5. In one embodiment, the height $H_1$ illustrates the spacing between the middle of the transfer waveguide 305 and the silicon layer 110. The value of $H_1$ and the thickness of the silicon layer 110 define the separation distance between the transfer waveguide 305 and the germanium 220. The height $H_2$ illustrates the spacing between the middle of the waveguide 125 and the silicon layer 110. Thus, the value of $H_2$ and the thickness of the silicon layer 110 define the separation distance between the waveguide 125 and the germanium 220.

In one embodiment, the value of $H_2$ is selected so that little or none of the light propagating in the waveguide 125 is absorbed in the germanium 220. That is, the waveguide 125 may be too far from the germanium 220 for the optical signal in the waveguide 125 to be absorbed by the germanium 220. This may be advantageous since this prevents the optical signal from being absorbed near an edge of the germanium 220 where the waveguide 125 begins to extend underneath the germanium 220, thereby mitigating dark currents. Instead, the waveguide 125 is optically coupled to the transfer waveguide 305 such that the optical signal is transferred from the waveguide 125 to the transfer waveguide 305. Moreover, the value of $H_1$ is selected so that the transfer waveguide 305 is optically coupled to the germanium 220. As described above, this causes much of the optical signal to be absorbed by the portion of the germanium underneath the first doped region 215 rather than the edges.

The specific values of $H_1$ and $H_2$ can vary depending on the widths of the waveguides 125 and 305. For example, the waveguide 125 may have a width of one micron (at its widest) and a thickness of 0.2 microns. The transfer waveguide 305 may have a width of 0.6 microns (at its widest) and a thickness of 0.2 microns. The length of the transfer waveguide 305 may match the length of the germanium 220. The value of $H_1$ may be around 0.8 microns while the value of $H_2$ may be around 0.4 microns.

The bandwidth of the optical detector illustrated in FIG. 6 can range from 1 GHz to 100 GHz.

Figure 7:
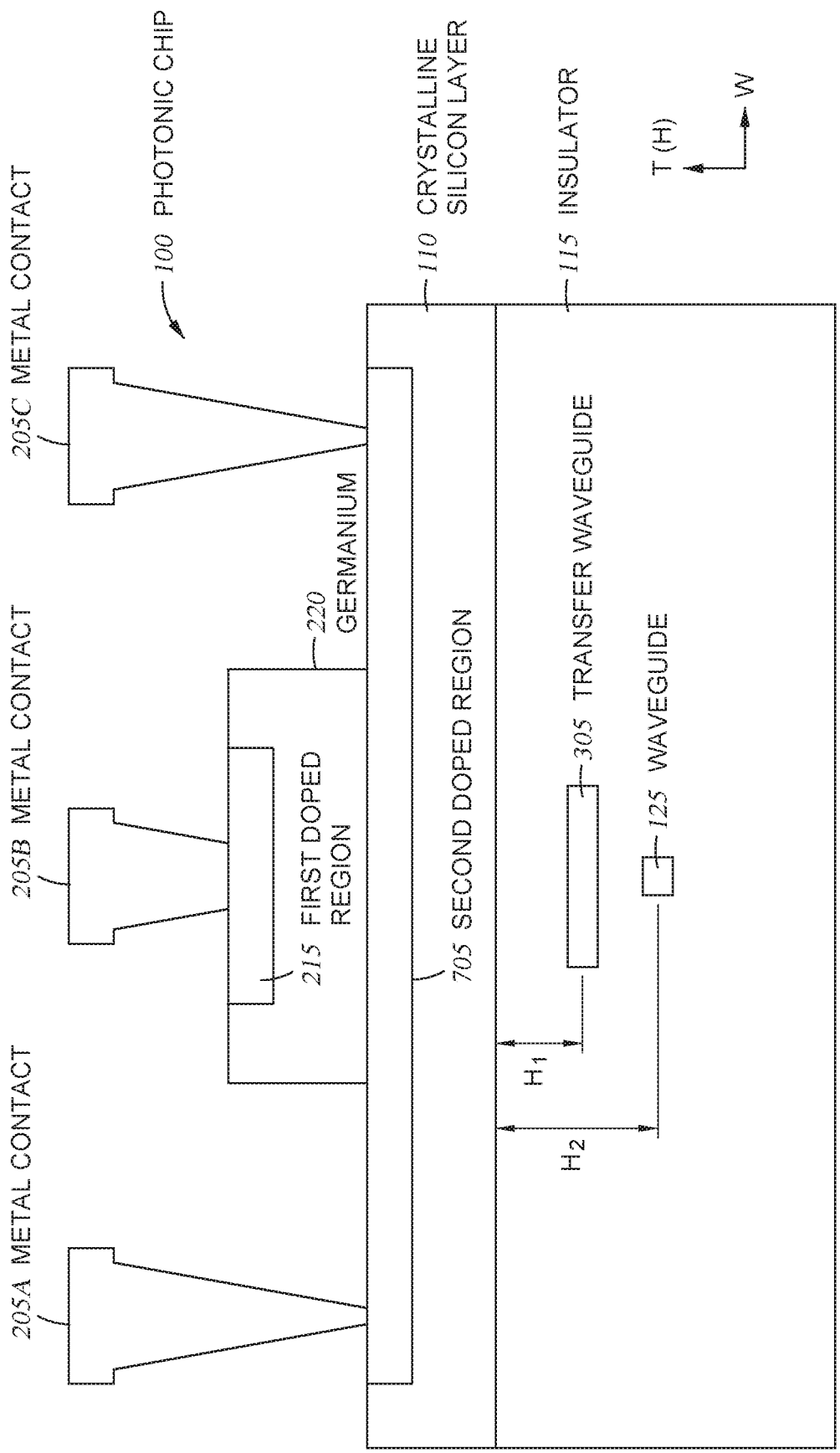
FIG. 7 illustrates a front view of transfer waveguide and the waveguide in the photonic chip, according to one embodiment described herein.

FIG. 7 illustrates a front view of transfer waveguide 305 and the waveguide 125 in the photonic chip 100, according to one embodiment described herein. Specifically, FIG. 7 includes the same components as those shown in FIG. 6; however, rather than having separate second doped regions disposed underneath the respective metal contacts 205A and 205C, the photonic chip 100 includes a unitary second doped region 705 which extends between the metal contacts 205A and 205C. As a result, the second doped region 705 extends below the germanium 220 and is between the germanium 220 and the waveguides 125 and 305.

Extending the second doped region 705 below the germanium 220 can provide a tradeoff between speed and responsivity of the optical detector. While the second doped region 705 may cause more of the optical signal to be absorbed in the silicon layer 110 rather than in the germanium 220 relative to the arrangement illustrated in FIG. 6 (which may have a negative impact on responsivity), doing so may improve the strength of the electrical field in the germanium 220 and increase the speed or bandwidth of the optical detector.

In one embodiment, for 300 nanometer thick germanium 220, the transit distance is less than 270 nanometers. As a result, the bandwidth can achieve approximately 100 GHz. For example, the transit speed is defined by its mobility as shown by:

$$v = \mu \times E \quad (1)$$

At sufficiently high bias, the mobility reaches a saturation value defined by:

$$\mu = \mu_{sat} = \mu \Big/ \sqrt{1 + \left(\mu \frac{E}{v_{sat}}\right)^2} \qquad (2)$$

The saturation value varies for different materials in a silicon-germanium system. For example, the $\mu_{sat}$ for electrons in Silicon is 1400 cm$^2$/V$_s$, for holes in Silicon is 500 cm$^2$/V$_s$, for electrons in Germanium is 3900 cm$^2$/V$_s$, and for holes in Germanium is 1900 cm$^2$/V$_s$. The $v_{sat}$ for electrons in Silicon is $10^7$ cm/s, for holes in Silicon is $0.7 \times 10^7$ cm/s, for electrons in Germanium is $0.7 \times 10^7$ cm/s, and for holes in Germanium is $0.63 \times 10^7$ cm/s.

Figure 8:
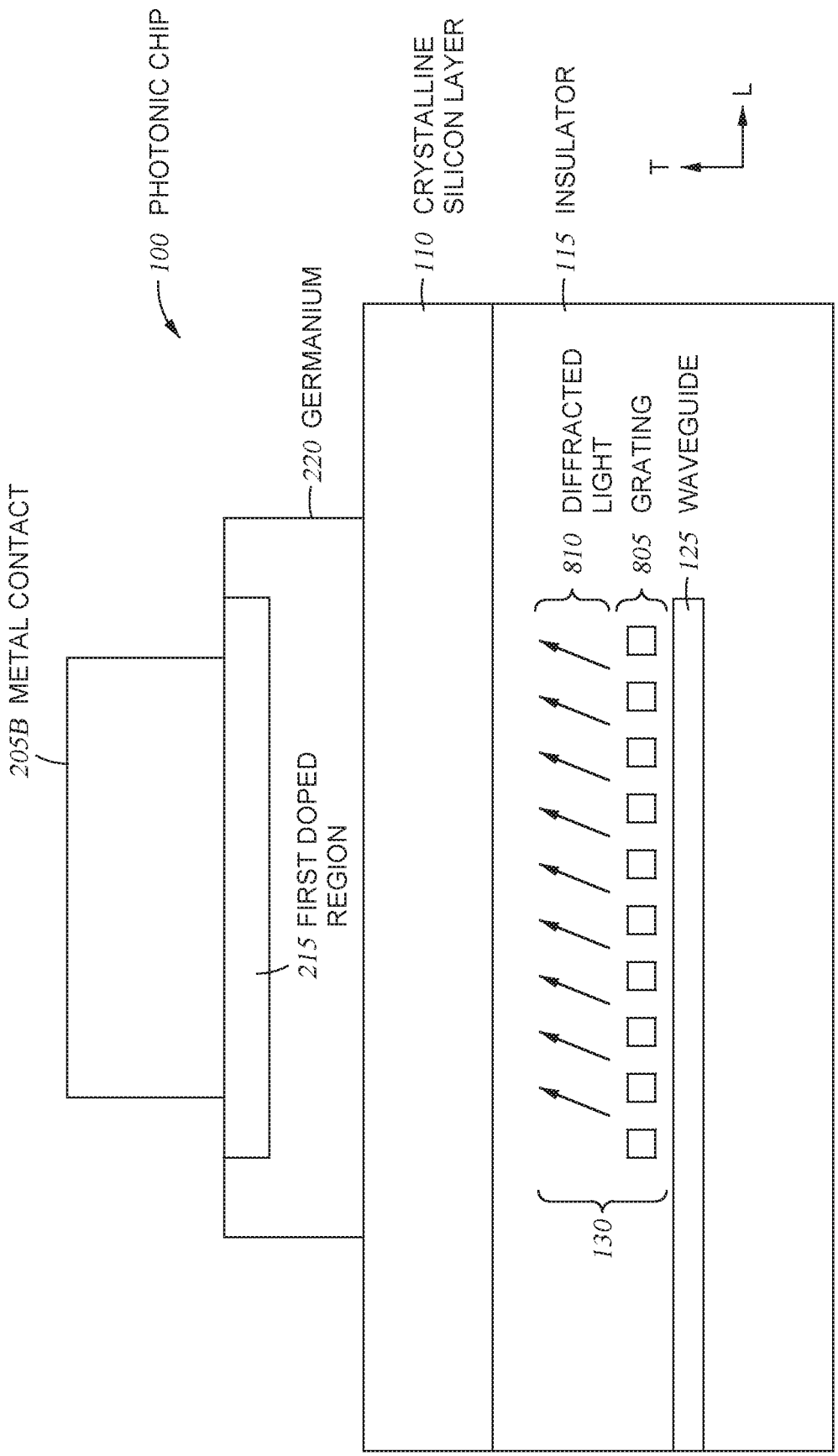
FIG. 8 illustrate an optical transfer structure that includes a grating, according to one embodiment described herein.

FIG. 8 illustrate an optical transfer structure that includes a grating 805, according to one embodiment described herein. Rather than using a transfer waveguide as described above, the photonic chip 100 in FIG. 8 includes the grating 805 which transfers an optical signal from the waveguide 125 to the germanium 220. Besides this change, the other components in FIG. 8 are the same as the ones discussed above.

The grating 805 is another example of the optical transfer structure 130 illustrated in FIGS. 1 and 2. The spacing between the waveguide 125 and the germanium 220 may be set so that the waveguide 125 is not (or only slightly) optically coupled to the germanium 220. As such, when the waveguide 125 extends below the germanium 220, very little of the optical signal emits from the portion of the waveguide 125 that is not covered by the grating 805 into the germanium 220. The grating 805 includes structures that are repeated with a defined spacing such that the gaps between the structures are the same throughout the grating 805. In one embodiment, the spacing in the grating 805 affects the angle at which light propagating in the waveguide 125 is diffracted by the grating 805 in a direction towards the germanium 220. This is illustrated by the diffracted light 810.

In one embodiment, the grating 805 diffracts the light towards a region in the germanium 220 which has a strong electric field. In one embodiment, the diffracted light 810 strikes a region that is underneath first doped region at a bottom surface of the germanium 220 and avoids the edges of the germanium 220 which can have weak electrical fields and results in large dark currents. For example, the vertical distance between the grating 805 and the germanium 220 can be made small enough that any angular spread of light emanating from the grating 805 is fully absorbed or captured by the germanium 220. Nonetheless, the waveguide 125 can be sufficiently spaced away from the germanium 220 to avoid the majority of the optical signal being coupled at an edge of the germanium 220.

The grating 805 may be formed from crystalline silicon, silicon nitride, silicon oxynitride, or other dielectrics. Moreover, given the angle of the diffracted light, the grating 805 may extend beyond the boundary of the germanium 220 (e.g., extend to the right of the germanium 220) and terminate within the boundary of the germanium 220. In FIG. 8, the grating 805 extends beyond the left edge of the germanium 220 but terminates before reaching the right edge of the germanium 220. Further, the grating 805 illustrated in FIG. 8 is just one example of a grating 805. In other examples, the grating 805 can different shapes and structures than what is shown.

Figure 9:
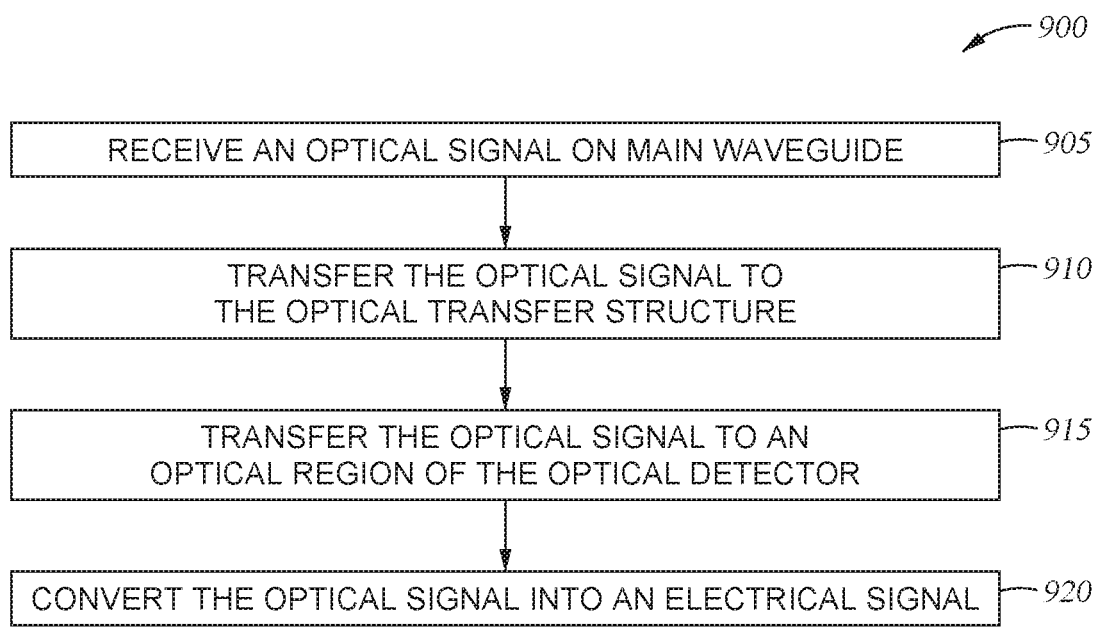
FIG. 9 is a flowchart for transferring an optical signal to an optical detector, according to one embodiment described herein.

FIG. 9 is a flowchart of a method 900 for transferring an optical signal to an optical detector, according to one embodiment described herein. At block 905, the optical detector receives an optical signal on a main waveguide. In one embodiment, the main waveguide extends underneath the optical detector but is spaced a sufficient distance so that little, if any, of the optical signal propagating in the main waveguide transfers to the optical detector without first being transferred to an optical transfer structure.

At block 910, the optical signal in the main waveguide is transferred to the optical transfer structure. As discussed above, the optical transfer structure can be a transfer waveguide with one or more tapered regions or a grating. However, the optical transfer structure is not limited to these examples and can include a multi-waveguide structure or multiple prongs which are optically coupled to the main waveguide and the optical detector material in the detector.

At block 915, the optical transfer structures transfers the optical signal to an optical region of the optical detector. That is, while the main waveguide is relatively weakly (or not at all) optically coupled to the optical detector, the optical transfer structure is relatively strongly optically coupled to the optical detector material detector. Although the embodiments above describe using germanium as the optical detector material, the spatial relationships between the main waveguide (e.g., the waveguide 125), the optical transfer structure, and the optical detector can be applied to other types of optical detector material (e.g., III-V semiconductors) that may be formed on a substrate, silicon or otherwise.

At block 920, the optical detector converts the optical signal into an electrical signal. For example, the optical signal absorbed by the optical detector generates a voltage and current which form the electrical signal. The electrical signal can then be transmitted to other electrical components in the photonic chip, or may be transmitted to a separate electrical integrated circuit which is electrically connected to the photonic chip.

The flowchart and block diagrams in the Figures illustrate the architecture, functionality and operation of possible implementations of systems, methods and computer program products according to various embodiments. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

We claim:

1. An optical detector, comprising:
   a substrate;
   germanium disposed on the substrate;
   a first waveguide disposed in the substrate and extending underneath the germanium; and
   an optical transfer structure disposed between the first waveguide and the germanium, wherein the first waveguide is spaced apart from the optical transfer structure, wherein the optical transfer structure is arranged to transfer an optical signal propagating in the first waveguide into the germanium by redirecting propagation of the optical signal from a first direction of propagation when in the first waveguide to a second direction of propagation towards the germanium, and wherein the germanium is configured to convert the optical signal into an electrical signal.

2. The optical detector of claim 1, wherein the first waveguide is disposed a first distance from the germanium in a first direction perpendicular to a second direction which the optical signal propagates in the first waveguide and the optical transfer structure is disposed a second distance from the germanium in the first direction, wherein the first distance is greater than the second distance.

3. The optical detector of claim 1, wherein the germanium comprises a first doped region formed in a first side of the germanium opposite a second side of the germanium facing the substrate, wherein a metal contact couples to the first doped region.

4. The optical detector of claim 3, wherein at least a portion of the optical transfer structure is disposed underneath the first doped region, wherein the first doped region does not extend to an edge of the germanium.

5. The optical detector of claim 3, further comprising: a crystalline silicon layer, wherein the second side of the germanium contacts the crystalline silicon layer, wherein the optical transfer structure is disposed between the crystalline silicon layer and the first waveguide.

6. The optical detector of claim 5, wherein the crystalline silicon layer includes at least one second doped region that includes an opposite type dopant than the first doped region, wherein, when the optical detector is operational, the first and second doped regions are arranged to generate an electrical field in the germanium.

7. The optical detector of claim 1, wherein the optical transfer structure comprises a transfer waveguide, the transfer waveguide comprising a first taper region overlaying a portion of the first waveguide.

8. The optical detector of claim 7, wherein the transfer waveguide comprises a second taper region, wherein a dimension of the transfer waveguide increases in the first taper region as the transfer waveguide extends in a first direction while the dimension of the transfer waveguide decreases in the second taper region as the transfer waveguide extends in the first direction.

9. The optical detector of claim 8, wherein the first and second taper regions are both contained within a boundary of the germanium.

10. The optical detector of claim 7, wherein a dimension of the first waveguide decreases in the first taper region as the first waveguide extends in a first direction, while the dimension of the transfer waveguide increases in the first taper region as the transfer waveguide extends in the first direction, and wherein the first waveguide terminates underneath the transfer waveguide.

11. The optical detector of claim 1, wherein the optical transfer structure comprises a grating arranged to diffract the optical signal propagating in the first waveguide towards the germanium.

12. An optical system, comprising:
a substrate;
an optical detector material disposed on the substrate;
a waveguide disposed in the substrate and extending underneath the optical detector material; and
an optical transfer structure disposed between the waveguide and the optical detector material, wherein the waveguide is spaced apart from the optical transfer structure, wherein the optical transfer structure is arranged to transfer an optical signal propagating in the waveguide into the optical detector material by redirecting propagation of the optical signal from a first direction of propagation from the first waveguide to a second direction of propagation towards the optical detector material, and wherein the optical detector material is configured to convert the optical signal into an electrical signal.

13. The optical system of claim 12, further comprising:
a first metal contact contacting a first side of the optical detector material.

14. The optical system of claim 13, further comprising: a silicon layer disposed between the optical detector material and the optical transfer structure; and
a second metal contact contacting the silicon layer, wherein, during operation, voltages on the first and second metal contacts generate an electrical field in the optical detector material.

15. The optical system of claim 14, wherein the waveguide and the optical transfer structure are surrounded by an insulator, wherein the insulator separates the waveguide and the optical transfer structure from the silicon layer.

16. A method, comprising:
transmitting an optical signal in a first waveguide, wherein the first waveguide extends underneath an optical detector material;
transferring the optical signal from the first waveguide into an optical transfer structure, wherein the optical transfer structure is disposed between the first waveguide and the optical detector material;
transferring the optical signal from the optical transfer structure to the optical detector material by redirecting propagation of the optical signal from a first direction of propagation when in the first waveguide to a second direction of propagation towards the optical detector material, wherein a gap is provided between the first waveguide and the optical transfer structure; and
converting the optical signal received in the optical detector material into an electrical signal.

17. The method of claim 16, wherein the optical transfer structure comprises one of: a tapered waveguide and a grating.

18. The method of claim 16, wherein the first waveguide is spaced apart from the optical detector material such that the first waveguide is not optically coupled to the optical detector material.

19. The method of claim 16, wherein the first waveguide terminates within a boundary of the optical detector material.

20. The method of claim 16, wherein converting the optical signal into the electrical signal comprises:
generating an electrical field in the optical detector material using a first metal contact contacting the optical detector material and a second metal contact contacting a semiconductor layer disposed between the optical detector material and the optical transfer structure.

* * * * *